United States Patent
Fujii

(10) Patent No.: US 7,782,624 B2
(45) Date of Patent: Aug. 24, 2010

(54) ELECTRONIC APPARATUS

(75) Inventor: Tomoharu Fujii, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 12 days.

(21) Appl. No.: 12/334,970

(22) Filed: Dec. 15, 2008

(65) Prior Publication Data

US 2009/0168367 A1    Jul. 2, 2009

(30) Foreign Application Priority Data

Dec. 27, 2007   (JP)   ............................. 2007-335689

(51) Int. Cl.
*H05K 7/20* (2006.01)
(52) U.S. Cl. .................. 361/720; 361/679.46; 361/719; 361/737; 257/686; 257/725; 257/728; 438/108; 438/149; 343/700 MS; 343/702; 343/846
(58) Field of Classification Search ............ 361/679.46, 361/679.54, 704–712, 715–722, 812, 816, 361/737, 760, 761, 782, 783; 257/48, 53, 257/686, 659, 706–728, 732, 737, 664, 666, 257/693, 698, 772, 777; 343/87, 700 MS, 343/702, 747, 745, 787, 876, 770, 846, 788, 343/830, 720, 793, 803, 767; 174/15.1, 16.3, 174/252, 35 R, 52.2; 165/80.3, 104.33, 185; 333/25; 438/51, 55, 106–108, 149, 160, 438/25, 26, 118, 125, 126, 127
See application file for complete search history.

(56) References Cited

U.S. PATENT DOCUMENTS

| | | | | |
|---|---|---|---|---|
| 5,903,239 A | * | 5/1999 | Takahashi et al. | 343/700 MS |
| 6,770,955 B1 | * | 8/2004 | Coccioli et al. | 257/659 |
| 6,818,985 B1 | * | 11/2004 | Coccioli et al. | 257/728 |
| 6,917,526 B2 | * | 7/2005 | Ajioka et al. | 361/816 |
| 7,119,745 B2 | * | 10/2006 | Gaucher et al. | 343/700 MS |
| 7,518,553 B2 | * | 4/2009 | Zhang et al. | 343/700 MS |
| 7,615,856 B2 | * | 11/2009 | Sakai et al. | 257/686 |
| 2005/0090300 A1 | * | 4/2005 | Zhang et al. | 455/575.7 |
| 2005/0179595 A1 | * | 8/2005 | Yamamoto | 343/700 MS |
| 2006/0049995 A1 | * | 3/2006 | Imaoka et al. | 343/702 |
| 2007/0120742 A1 | * | 5/2007 | Soler Castany et al. | 343/700 MS |
| 2007/0194427 A1 | * | 8/2007 | Choi et al. | 257/686 |

FOREIGN PATENT DOCUMENTS

JP    2007-266443    10/2007
WO   WO2007049376 A1 *   5/2007

* cited by examiner

*Primary Examiner*—Michael V Datskovskiy
(74) *Attorney, Agent, or Firm*—Rankin, Hill & Clark LLP

(57) ABSTRACT

An electronic apparatus includes a semiconductor chip 15, a first substrate 10A having an antenna 12 formed on a first face 10*a* thereof and having the semiconductor chip 15 loaded on a second face 10*b* thereof, a second substrate 20A on which the first substrate 10A is provided so as to face the semiconductor chip 15, and which is connected to the outside, copper core solder balls 18 electrically connecting the first substrate 10A and the second substrate 20A, and a resin material 30 disposed between the first substrate 10A and the second substrate 20A. The second substrate 20A is provided with a thermal via 27 which radiates the heat in the semiconductor chip 15.

8 Claims, 4 Drawing Sheets

ELECTRONIC APPARATUS

BACKGROUND OF THE INVENTION

The present invention relates to an electronic apparatus, and particularly, to an electronic apparatus having an antenna, and an electronic element which generates heat.

With miniaturization of wireless communication apparatuses in recent years, miniaturization of electronic apparatuses to be loaded onto the wireless communication apparatuses is desired. As a miniaturized electronic apparatus, for example, one disclosed in Patent Document 1 is known. FIG. 1 is a view showing the schematic construction of the electronic apparatus 100 disclosed in Patent Document 1.

The electronic apparatus 100 shown in this drawing is constituted by a substrate 110, a semiconductor chip 115, copper core solder balls 118, etc. The substrate 110 is a double-sided printed circuit board. An antenna 112 is formed on the top face of a substrate body 111, and a wiring pattern 113 is formed on the bottom face of the substrate body. The antenna 112 and the wiring pattern 113 are connected together by a via 114.

The semiconductor chip 115 has bumps 116 formed thereon, and is flip-chip joined to pads formed in the wiring pattern 113 of the substrate 110. Further, underfill resin 117 is disposed between the semiconductor chip 115 and the substrate body 111. Furthermore, the ends of the wiring pattern 113 are provided with the copper core solder balls 118 which become external connecting terminals.

The electronic apparatus 100 constructed as above is mounted onto a mother board 119, as shown in FIG. 2. In this case, the electronic apparatus 100 is mounted onto the mother board 119 such that the semiconductor chip 115 faces the mother board 119, in other words, such that the antenna 112 be located outside.

Meanwhile, generally, the semiconductor chip 115 corresponding to high frequency, which is disposed along with the antenna 112, generates a lot of heat. Typically, a heat-radiating member (for example, radiating fins, etc.) is used for the cooling of the semiconductor chip which heat generates in this way. However, since the electronic apparatus 100 is adapted such that the semiconductor chip 115 faces the mother board 119 in a mounted state (refer to FIG. 2), the semiconductor chip 115 cannot be provided with the heat-radiating member.

Further, it is also considered that the heat-radiating member is provided on the face of the substrate 110 opposite to the face where the semiconductor chip 115 is disposed. However, in the electronic apparatus 100, the antenna 112 is formed on this opposite face. Therefore, this part cannot be provided with the heat-radiating member. For this reason, with the heat-radiating member, such as radiating fins, the heat generated in the semiconductor chip 115 cannot be effectively radiated.

Thus, as shown in FIG. 2, it is considered that a TIM 120 (heat-radiating material: Thermal Interface Material) is interposed between the semiconductor chip 115 and the mother board 119 in a mounted state, and thereby, the heat from the semiconductor chip 115 is radiated to the mother board 119. As this TIM 120, grease, elastomer (high polymer with elasticity) sheet, RTV (Room Temperature Vulcanization) rubber, etc. can be used. [Patent Document 1] JP-A-2007-266443

However, when this method is used actually, it is necessary to dispose the TIM 120 between the semiconductor chip 115 and the mother board 119 in advance before the copper core solder balls 118 are soldered to the mother board 119 by reflow processing. For this reason, the TIM 120 to be used needs reflow heat resistance. As a result, selection of the TIM 120 is limited, and an increase in the cost of the TIM 120 is expected.

Further, the thickness of TIM 120 is involved with the mountability of the copper core solder balls 118 and the mother board 119. That is, if the thickness of TIM 120 is larger than a rated value, a clearance may be created between the copper core solder balls 118 and the mother board 119, and the mounting reliability may deteriorate. In preventing this, there is a problem in that the thickness control of the TIM 120 should be performed accurately.

SUMMARY OF THE INVENTION

The invention has been made in view of the above points, and the object thereof is to provide an electronic apparatus capable of reliably radiating the heat generated in an electronic element without deteriorating mountability.

In order to solve the above problems, according to a first aspect of the invention, there is provided an electronic apparatus including:

an electronic element, a first substrate having an antenna formed on one face thereof and having the electronic element loaded on the other face thereof, a second substrate on which the first substrate is provided so as to face the electronic element, and in which an external connecting portion is provided, a connecting member electrically connecting the first substrate and the second substrate, and a resin material disposed between the first substrate and the second substrate, wherein the second substrate is provided with a thermal via which radiates the heat in the electronic element.

According to a second aspect of the invention, there is provided the electronic apparatus according to the first aspect, wherein the thermal via is provided in a position which faces the electronic element.

According to a third aspect of the invention, there is provided an electronic apparatus including:

an electronic element, a first substrate having an antenna formed on one face thereof and having the electronic element loaded on the other face thereof, a second substrate on which the first substrate is provided so as to face the electronic element, and in which an external connecting portion is provided, a connecting member electrically connecting the first substrate and the second substrate, and a resin material disposed between the first substrate and the second substrate, wherein an inorganic filler which increases thermal conductivity is mixed in the resin material.

According to a forth aspect of the invention, there is provided the electronic apparatus according to the third aspect, wherein the filling ratio of the inorganic filler into the resin material is set to 70% or more and 90% or less.

According to a fifth aspect of the invention, there is provided the electronic apparatus according to the third or forth aspect, wherein the particle diameter of the inorganic filler is set to 30 µm or more and 70 µm or less.

According to a sixth aspect of the invention, there is provided the electronic apparatus according to any one of the third to fifth aspects, wherein the material of the inorganic filler is aluminum nitride.

According to a seventh aspect of the invention, there is provided the electronic apparatus according to any one of the first to sixth aspects, wherein at least one of the first substrate and the second substrate is a multilayer wiring substrate, and one layer of inner layers in the multilayer substrate is a ground layer.

According to the invention, the heat generated in the electronic element is radiated via the resin material in which the inorganic filler is mixed or the thermal via is formed in the second substrate. The thermal via is formed in the second substrate, and the mold resin is disposed between the first substrate and the second substrate. Accordingly, when the electronic apparatus is mounted onto a substrate, etc. (for example, a mother board, etc.), the thermal via or the mold resin does not affect mountability. Therefore, while the mountability of the electronic apparatus to the substrate can be improved, the heat generated in the electronic element can be efficiently radiated.

DETAILED DESCRIPTION OF THE PREFERRED EMBODIMENTS

Hereinafter, best modes for carrying out the invention will be described along with the drawings.

Figure 1:
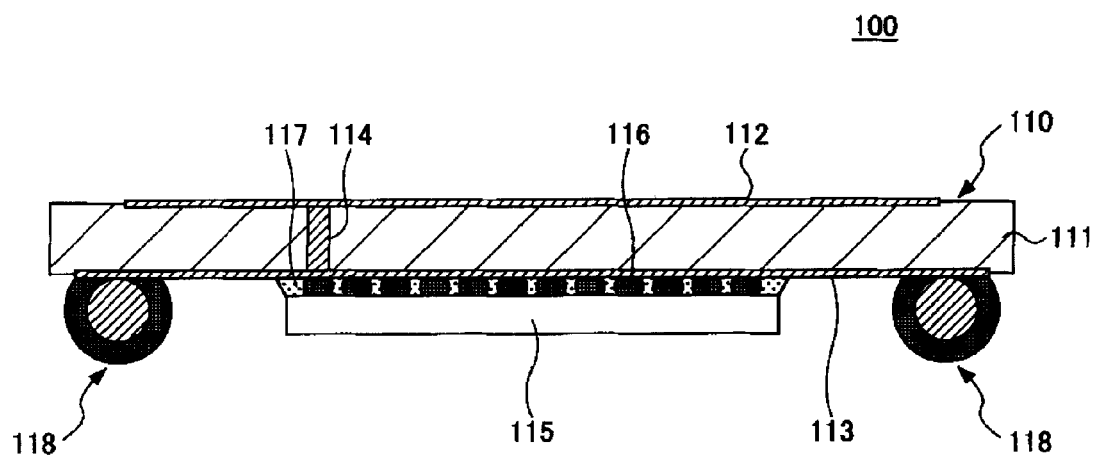
FIG. 1 is a sectional view showing an electronic apparatus which is a conventional example.
Figure 2:
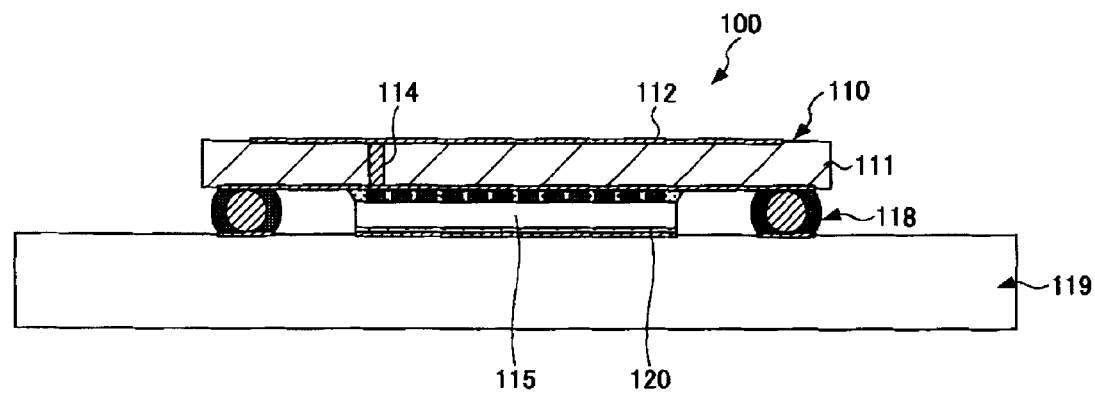
FIG. 2 is a view showing a state where the electronic apparatus which is a conventional example has been mounted onto a mother board.
Figure 3:
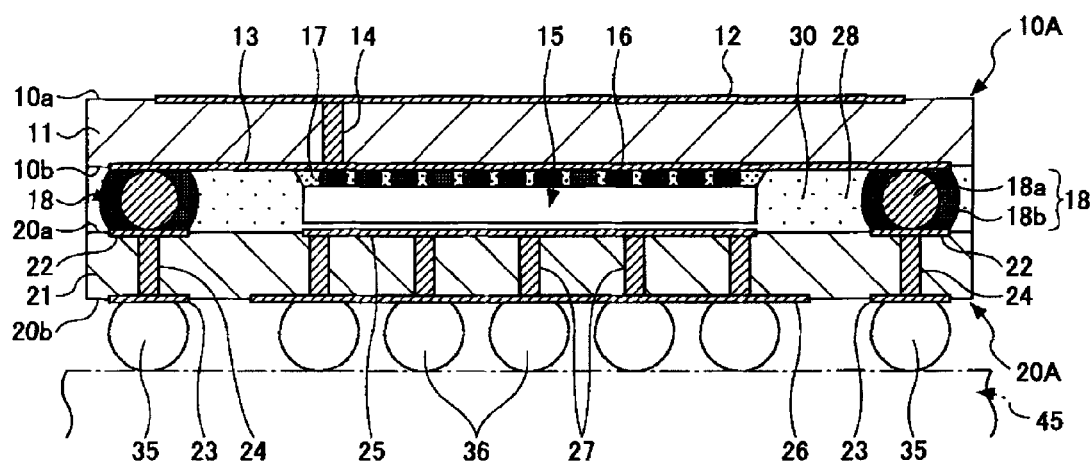
FIG. 3 is a sectional view showing an electronic apparatus which is a first embodiment of the invention.

FIG. 3 is a sectional view showing an electronic apparatus 1A which is a first embodiment of the invention. The electronic apparatus 1A has substrate structure in which an antenna 12 is formed in a surface portion, and a semiconductor chip 15 is built in. Further, the electronic apparatus 1A is mounted onto a mounting board, such as a mother board 45 (shown by one-dot chain lines in the drawing).

The electronic apparatus 1A is generally constituted by a first substrate 10A, the semiconductor chip 15, copper core solder balls 18, a second substrate 20A, a mold resin 30, etc.

The first substrate 10A is a double-sided printed circuit board, and uses a copper-clad laminate, such as FR-4. Specifically, a copper film is formed on both sides of a substrate body 11 with insulating properties made of epoxy, etc., and are constructed such that the antenna 12 and a wiring pattern 13 are formed by patterning the copper film by etching, etc.

The antenna 12 is formed on a first face 10a (top face in FIG. 3) exposed to the outside of the first substrate 10A. Further, the wiring pattern 13 is formed on a second face 10b of the first substrate 10A which is a face opposite to the first face 10a. Further, the first substrate 10A is formed with a via 14 which passes through substrate body 11 to thereby allow the first face 10a to communicate with the second face 10b, and the antenna 12 and the wiring pattern 13 are constructed so as to be electrically connected together by the via 14.

In this embodiment, the first face 10a of the first substrate 10A is constructed so as to be formed only by the antenna 12. Therefore, the pattern of the antenna 12 can be set with degrees of freedom. As the structure of the antenna 12, it is possible to adopt various structures, such as a patch antenna, a reverse F-type antenna, and a dipole antenna.

The semiconductor chip 15 is a chip corresponding to high frequency, and generates heat by the operation thereof. The semiconductor chip 15 is loaded as being flip-chip joined to the second face 10b of the first substrate 10A. That is, bumps 16 are formed in advance on electrodes formed on the semiconductor chip 15, and pads are provided in bump joint positions of the wiring pattern 13 formed on the second face 10b. Also, the semiconductor chip 15 is loaded onto the first substrate 10A by joining the bumps 16 to the pads of the wiring pattern 13. Further, in order to improve connection reliability, underfill resin 17 is filled between the semiconductor chip 15 and the first substrate 10A.

In addition, for the convenience of illustration, the respective drawings show that the wiring pattern 13 is connected with all the plurality of bumps 16. However, the actual wiring pattern 13 is a pattern in which pads are independently formed so as to correspond to the bumps 16.

The second substrate 20A uses a copper-clad laminate, such as FR-4, similarly to the first substrate 10A. That is, a copper film is formed on both sides of the substrate body 21 having insulating properties made of epoxy, etc., and are constructed such that bump joining electrodes 22, electrodes 23 for external connection, a first heat-radiating pattern 25, a second heat-radiating pattern 26, etc. are formed by patterning this copper film by etching, etc.

The bump joining electrodes 22 and the electrodes 23 for external connection are formed in the arrangement positions of the copper core solder balls 18 or balls 35 for external connection to be described later. Further, the first and second heat-radiating patterns 25 and 26 are so-called solid patterns, and are formed in a region which faces the semiconductor chip 15. The bump joining electrodes 22 and the first heat-radiating pattern 25 are formed on a first face 20a (the side which faces the first substrate 10A) of the second substrate 20A which is located inside, and the electrodes 23 for external connection and the second heat-radiating pattern 26 are formed on a second face 20b which is located outside (the side opposite to the first face 20a).

Further, the second substrate 20A is formed with a plurality of vias 24 and thermal vias 27 which are formed so as to pass through the substrate body 21. The vias 24 are formed in the arrangement positions of the copper core solder balls 18, and electrically connect the bump joining electrodes 22 with the electrodes 23 for external connection.

Further, the plurality of thermal vias 27 are formed within a region (namely, within a region which faces the semiconductor chip 15) where the first and second heat-radiating patterns 25 and 26 are formed. The thermal vias 27 thermally connect the first heat-radiating pattern 25 with the second heat-radiating pattern 26.

That is, the thermal vias 27 function as heat passages which perform heat transfer towards the second heat-radiating pattern 26 from the first heat-radiating pattern 25. Accordingly, the diameters of the vias 24 and the thermal vias 27 are not necessarily made equal to each other. If the calorific value of the semiconductor chip 15 is large, the thermal vias 27 may be constructed so as to have a larger diameter than the vias 24.

In addition, the first substrate 10A and the second substrate 20A are adapted to have the same shape, and are sized to have, for example, 15 mm×15 mm×0.2 mm. Further, the semiconductor chip 15 is sized to have, for example, 10 mm×10 mm×0.3 mm.

Each of the copper core solder balls 18 is constructed such that a solder film 18b is coated on a spherical copper core 18a. The copper core solder ball 18 electrically connects the wiring pattern 13 with the bump joining electrode 22, and also functions as a spacer which maintains the separation distance between the first substrate 10A and the second substrate 20A to a rated value. In this embodiment, a copper ball having a diameter of 0.5 mm is used as the copper core 18a. In addition, instead of the copper core 18a, it is also possible to use a metal sphere made of other materials or a solid sphere made of resin.

Figure 5A:
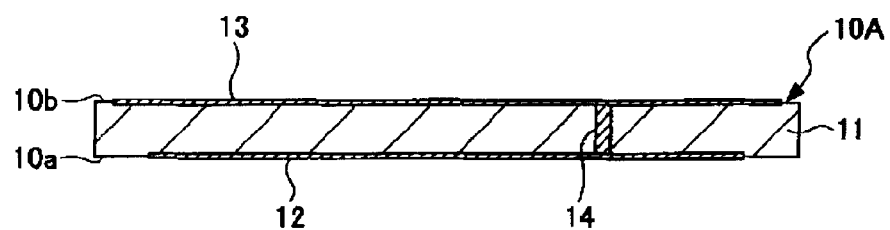
FIGS. 5A to 5E are sectional views showing a manufacturing method of the electronic apparatus which is the first embodiment of the invention (method 1).
Figure 5B:
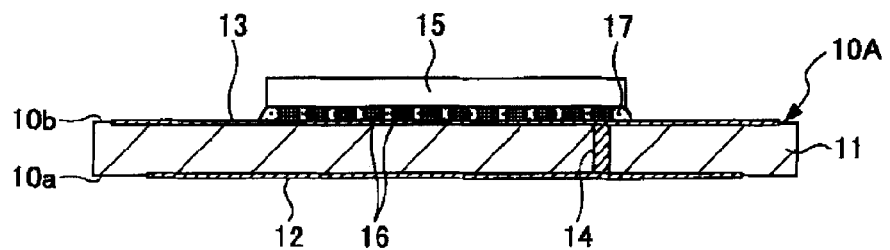
Figure 5C:
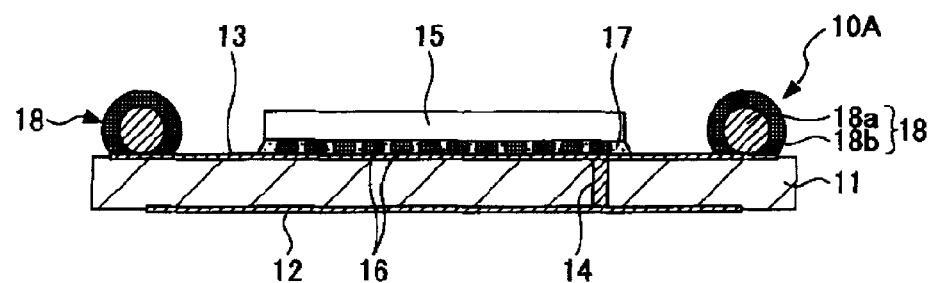
Figure 5D:
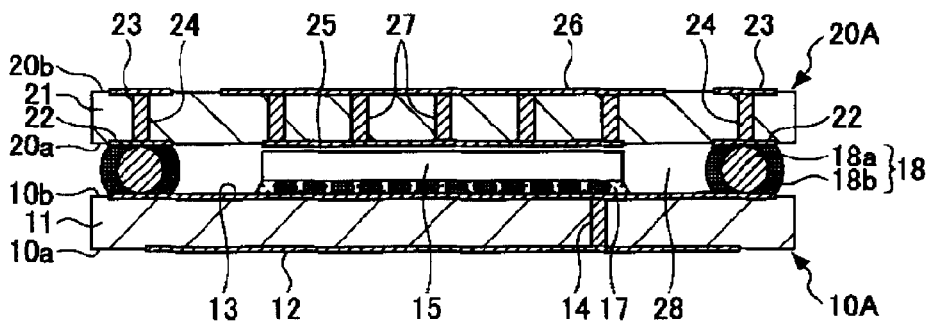
Figure 5E:
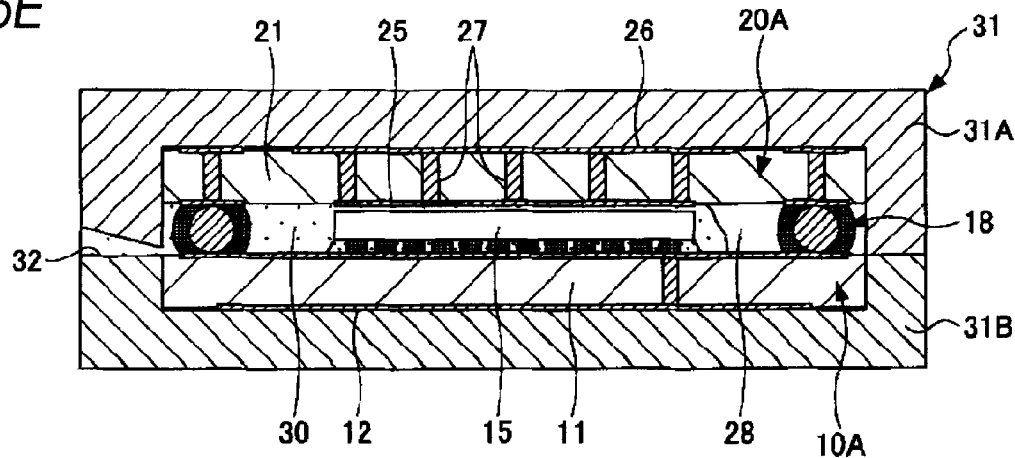

By interposing the copper core solder balls 18, the mold resin 30 is disposed in a space 28 formed between the first substrate 10A and the second substrate 20A (refer to FIG. 5E). The mold resin 30 is constructed such that inorganic filler having high thermal conductivity is mixed in, for example, an epoxy resin, etc.

As this inorganic filler, aluminum nitride, alumina, silica, silicon carbide, etc. can be used. Further, it is preferable that the filling ratio of the inorganic filler to be mixed in the mold resin 30 be 70% or more and 90% or less. This is because, if the filling ratio becomes less than 70%, the matching of the coefficients of thermal expansion of the first and second substrates 10A and 20A, the semiconductor chip 15, and the mold resin 30 becomes difficult (a trouble that the coefficient of thermal expansion of the mold resin 30 becomes high occur), and if the filling ratio exceeds 90%, a trouble that the moldability of the mold resin 30 deteriorates (the viscosity of the mold resin becomes high) occurs.

Further, it is preferable that the particle diameter of the inorganic filler to be mixed in the mold resin 30 be 30 μm or more and 70 μm ore less. This is because, if the particle diameter of the filler becomes less than 30 μm, a trouble that the moldability of the mold resin 30 deteriorates (the viscosity of the mold resin 30 becomes high) occurs, and if the particle diameter of the filler exceeds 70 μm, the matching of the coefficients of thermal expansion of the first and second substrates 10A and 20A, the semiconductor chip 15, and the mold resin 30 becomes difficult (a trouble that the coefficient of thermal expansion of the mold resin 30 becomes high occur).

The balls 35 for external connection and heat-radiating balls 36 are all solder balls. The balls 35 for external connection are solder balls for making electrical connection with the mother board 45. On the other hand, the heat-radiating balls 36 are solder balls for radiating to the mother board 45 the heat, which is generated in the semiconductor chip 15, to be heat-transferred via the thermal vias 27. Therefore, the heat-radiating balls are not necessarily limited to the solder balls, and balls made of other materials having high thermal conductivity can also be used.

In the electronic apparatus 1A constructed as above, the mold resin 30 is disposed so as to seal the semiconductor chip 15 disposed between the first substrate 10A and the second substrate 20A, and a filler having the aforementioned properties and having high thermal conductivity is mixed in the mold resin 30. Therefore, the heat generated in the semiconductor chip 15 can be efficiently radiated to the mold resin 30.

Further, the first heat-radiating pattern 25, the thermal vias 27, and the second heat-radiating pattern 26 are formed in the region of the second substrate 20A which face the semiconductor chip 15. Further, a separated portion between the semiconductor chip 15 and the first heat-radiating pattern 25 is also filled with the mold resin 30 which has high thermal conductivity.

For this reason, the heat generated in the semiconductor chip 15 is heat-conducted to the thermal vias 27 via the mold resin 30 and the first heat-radiating pattern 25, and is radiated to the mother board 45 via the second heat-radiating pattern 26 and the heat-radiating balls 36 from the thermal vias 27. Therefore, this also enables the heat generated in the semiconductor chip 15 to be efficiently radiated to the outside.

Furthermore, in this embodiment, the thermal vias 27 and the mold resin 30 to be used as elements required for the heat radiation of the semiconductor chip 15 constitute the electronic apparatus 1A. Specifically, the thermal vias 27 are formed in the second substrate 20A, and the mold resin 30 is disposed between the first substrate 10A and the second substrate 20A.

Accordingly, when the electronic apparatus 1A is mounted onto the mother board 45, the thermal vias 27 and the mold resin 30 do not affect mountability. Therefore, the mountability of the electronic apparatus 1A to the mother board 45 can be improved, and as described above, the heat generated in the semiconductor chip 15 can be efficiently radiated to the outside.

Next, a second embodiment of the invention will be described.

Figure 4:
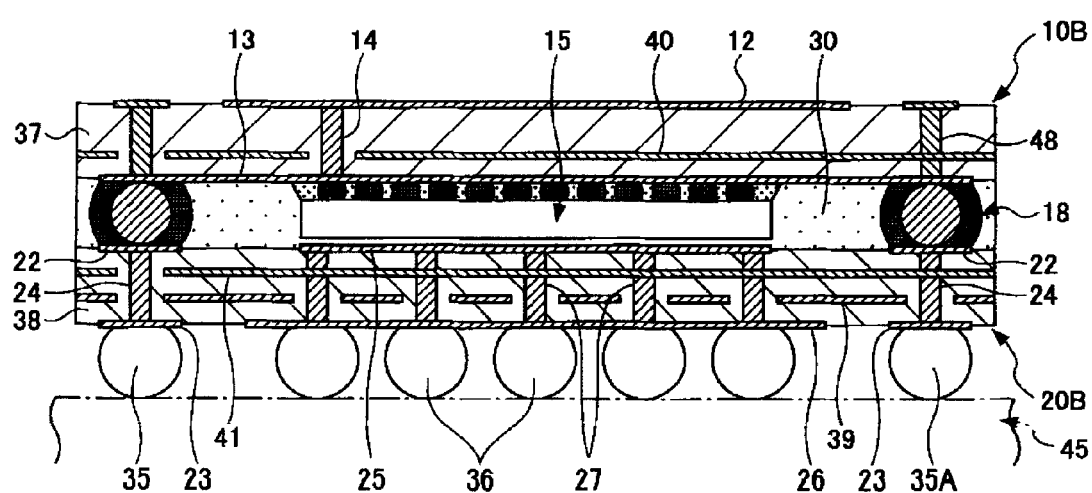
FIG. 4 is a sectional view showing an electronic apparatus which is a second embodiment of the invention.

FIG. 4 shows an electronic apparatus 1B which is a second embodiment. In addition, components in FIG. 4 corresponding to the components shown in FIG. 3 are designated by the same reference numerals, and the description thereof is omitted.

In the electronic apparatus 1A related to the aforementioned first embodiment, double-sided printed circuit boards have been used as the first and second substrates 10A and 20A. In contrast, in this embodiment, multilayer wiring substrates are used as the first substrate 10B and the second substrate 20B.

The first substrate 10B is constructed such that three conductive layers are formed in an insulating layer 37. A conductive layer provided in the uppermost layer is used as the antenna 12. Further, a conductive layer formed in the lowermost layer is used as the wiring pattern 13. Also, a wiring layer formed in the middle layer is used as a ground layer 40.

The second substrate 20B is constructed such that four conductive layers are formed in an insulating layer 38. A conductive layer provided in the uppermost layer is used as the bump joining electrodes 22 and the first heat-radiating pattern 25. Further, a conductive layer formed in the lowermost layer is used as the electrodes 23 for external connection, and the second heat-radiating pattern 26. Further, an inner layer wiring 39 and a ground layer 41 are formed in the interlayer.

In this embodiment, a ball for external connection designated by reference numeral 35A in the drawing is connected to the ground of the mother board 45. Further, the ball 35A for external connection is connected with the ground layer 41 via the via 24, and is connected with the ground layer 40 via a via 48 formed in the first substrate 10B and the copper core solder ball 18. Accordingly, the ground layers 40 and 41 are set to the ground potential.

Here, when attention is paid to the arrangement positions of the ground layers 40 and 41, the ground layer 40 is disposed in a position above the semiconductor chip 15, and the ground layer 41 is disposed below the semiconductor chip 15. Furthermore, the formation region of the ground layers 40 and 41 is formed to be wider than the area of the semiconductor chip 15 (is adapted to have almost the same shape as the shape of the electronic apparatus 1B in plan view).

That is, the electronic apparatus 1B according to this embodiment is constructed such that the semiconductor chip 15 is sandwiched between the ground layers 40 and 41 set to the ground potential. Thereby, even if a chip using high frequency is used as the semiconductor chip 15, the radiation from the semiconductor chip 15 can be shielded by the ground layers 40 and 41. Thereby, when the electronic apparatus 1B is mounted onto the mother board 45, a noise does not occur from the electronic apparatus 1B, and consequently, an adverse effect can be prevented from being exerted on the parts to be mounted near the electronic apparatus 1B.

Subsequently, a manufacturing method of the electronic apparatus constructed as above will be described with reference to FIGS. 5 and 6.

In addition, in the following description, the manufacturing method of the aforementioned electronic apparatus 1A will be exemplified. In addition, even in FIGS. 5 and 6, components corresponding to the components shown in FIG. 3 are designated by the same reference numerals, and the description thereof is omitted.

In manufacturing the electronic apparatus 1A, a double-sided copper-clad laminate in which a copper film is formed on both sides of the substrate body 11 made of an insulating material first is prepared. The via 14 which passes through the substrate body 11 in which the copper film is formed on both sides is formed in the substrate body. Furthermore, a resist material is disposed on the first face 10a and second face 10b of the substrate body 11, and the resist is then removed except for the formation positions of the antenna 12 and the wiring pattern 13.

Subsequently, by performing etching on the copper film by using the resist patterned in this way as a mask, the antenna 12 is formed on the first face 10a, and the wiring pattern 13 is formed on the second face 10b.

FIG. 5A shows the first substrate 10A in which the antenna 12 and the wiring pattern 13 are formed. In addition, as mentioned above, for the convenience of illustration, the respective drawings show that the wiring pattern 13 is connected with all the plurality of bumps 16. However, the actual wiring pattern 13 is a pattern in which pads are independently formed so as to correspond to the bumps 16.

Subsequently, the semiconductor chip 15 is loaded onto the first substrate 10A. The bumps 16 are formed in advance on the electrodes of the semiconductor chip 15, and the semiconductor chip 15 is flip-chip joined to the second face 10b of the first substrate 10A. The pads to be joined to the bumps 16 of the semiconductor chip 15 are formed in the wiring pattern 13 formed in the first substrate 10A. The bumps 16 are joined to the pads formed in the wiring pattern 13.

Thereby, the semiconductor chip 15 is connected to the wiring pattern 13, and is connected with the antenna 12 via the via 14. Further, in order to increase the joining reliability of the semiconductor chip 15 and the first substrate 10A, the underfill resin 17 is formed between the semiconductor chip 15 and the first substrate 10A. FIG. 5B shows a state where the semiconductor chip 15 has been loaded on the first substrate 10A.

When the semiconductor chip 15 is loaded onto the first substrate 10A, the copper core solder balls 18 are continuously disposed in the first substrate 10A. The wiring pattern 13 is formed with connection pads to which the copper core solder balls 18 are connected. In disposing the copper core solder balls 18 in the first substrate 10A, first, cream solder are applied to the connection pads formed in this wiring pattern 13, and then, the copper core solder balls 18 are disposed on the solder. FIG. 5C shows a state where the copper core solder balls 18 are disposed in the first substrate 10A.

In addition, as mentioned above, the copper core solder balls 18 are constructed such that the solder film 18b is coated on the surface of the copper core 18a. However, it is also possible to use a core made of other materials instead of the copper core 18a.

Subsequently, the second substrate 20A is disposed on the copper core solder balls 18 disposed on the first substrate 10A as mentioned above. In this case, cream solder is applied to the upper portions of the copper core solder balls 18 in advance.

The second substrate 20A can be formed from a double-sided copper-clad laminate in which a copper film is formed on both sides of the substrate body 21 made of an insulating material similarly to the aforementioned first substrate 10A. In the second substrate 20A, the bump joining electrodes 22, the electrodes 23 for external connection, the first heat-radiating pattern 25, the second heat-radiating pattern 26, the vias 24, and the thermal vias 27 are formed in advance. However, this forming method can be performed by the same technique described in the manufacturing method of the first substrate 10A.

When the second substrate 20A is provided on the first substrate 10A via the copper core solder balls 18 as mentioned above, then the first and second substrates 10A and 20A which are provided are continuously loaded into a reflow apparatus where reflow processing is performed. Thereby, the solder included in the cream solder, and the solder film 18b of the copper core solder ball 18 melts, and the copper core 18a is soldered to the wiring pattern 13 of the first substrate 10A, and the bump joining electrodes 22 of the second substrate 20A.

In this case, the separation distance between the second face 10b of the first substrate 10A and the first face 20a of the second substrate 20A becomes a distance equal to the diameter of the copper core 18a. Therefore, the space 28 adapted to have a separation distance corresponding to the diameter of the copper core 18a is formed between the first substrate 10A and the second substrate 20A. FIG. 5D shows a state where the first substrate 10A and the second substrate 20A are provided via the copper core solder balls 18.

Subsequently, the first and the second substrates 10A and 20A which are provided are mounted onto a mold 31 as shown in FIG. 5E. The mold 31 is constituted by an upper mold 31A and a lower mold 31B, and cavities on which the first and the second substrates 10A and 20A which are provided are to be mounted are formed in the upper mold 31A and the lower mold 31B. Further, a mold gate 32 is formed a position which communicates with in the space 28 of the mold 31 in a state where the first and the second substrates 10A and 20A are mounted.

The mold resin 30 is pressed into the mold 31 from the mold gate 32. As mentioned above, since the mold gate 32 communicates with the space 28, the mold resin 30 introduced from the mold gate 32 is charged into the space 28. FIG. 5E shows a state where the mold resin 30 is charged into the space 28.

In addition, during the filling of the mold resin 30, a suction hole may be formed in a position which faces the mold gate 32 of the mold 31, and the mold resin 30 may be charged into the mold 31 while vacuum suction is performed from the suction hole. By using this method, the charging efficiency of the mold resin 30 into the space 28 can be improved, and formation of voids in the space can be prevented.

Figure 6A:
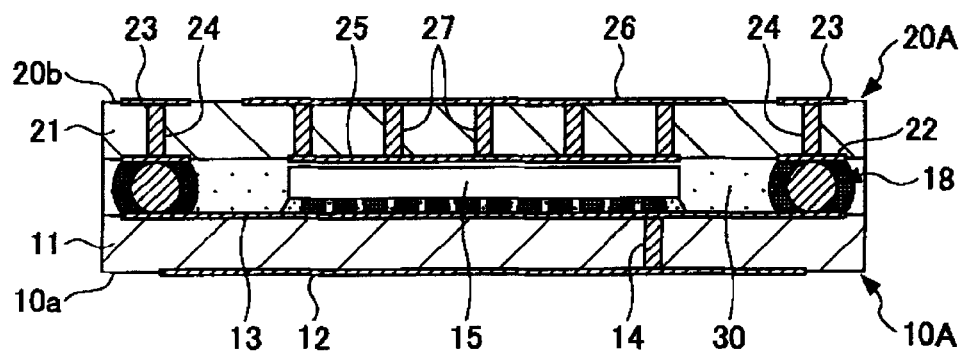
FIGS. 6A and 6B are sectional views showing a manufacturing method of the electronic apparatus which is the first embodiment of the invention (method 2).

When the mold resin 30 is charged into the space 28, the first and the second substrates 10A and 20A are released from the mold 31. FIG. 6A shows that the mold resin 30 is formed and the first and the second substrates 10A and 20A are released from the mold 31. Thereafter, deburring or cleaning is performed if necessary.

Figure 6B:
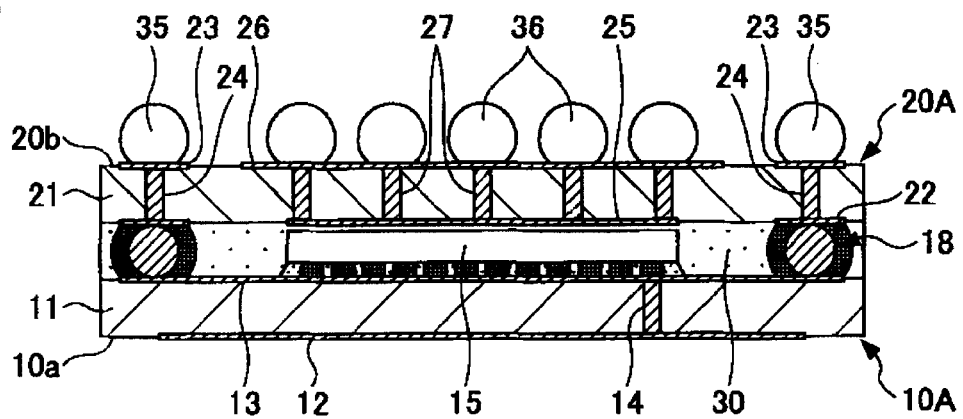

Subsequently, as shown in FIG. 6B, the balls 35 for external connection are disposed on the electrodes 23 for external connection formed on the second face 20b of the second substrate 20A, and the heat-radiating balls 36 are disposed on the second heat-radiating pattern 26. Thereby, the electronic apparatus 1A shown in FIG. 3 is manufactured. As such, since the manufacturing method according to this embodiment can be performed using general substrate manufacturing technology, the cost required for facility infrastructure can be reduced, and the product cost can be reduced.

Although the preferred embodiments of the invention has been described in detail, the invention is not limited to the above specific embodiments, but various modifications or alternations can be made thereto within the range of the gist of the invention set forth in the claims.

For instance, an example using the semiconductor chip 15 as an electronic element is exemplified in the above embodiments. However, the chip to be loaded on the first substrate 10A is not limited to the semiconductor chip, and other electronic components (for example, capacitors, registers, inductors, etc.) may be used.

What is claimed is:

1. An electronic apparatus comprising:
an electronic element,
a first substrate having an antenna formed on one face thereof and having the electronic element loaded on the other face thereof,
a second substrate on which the first substrate is provided so as to face the electronic element, and in which an external connecting portion is provided,
a connecting member electrically connecting the first substrate and the second substrate, and
a resin material disposed between the first substrate and the second substrate, wherein
the second substrate is provided with a thermal via which radiates the heat in the electronic element.

2. The electronic apparatus according to claim 1, wherein the thermal via is provided in a position which faces the electronic element.

3. An electronic apparatus comprising:
an electronic element,
a first substrate having an antenna formed on one face thereof and having the electronic element loaded on the other face thereof,
a second substrate on which the first substrate is provided so as to face the electronic element, and in which an external connecting portion is provided,
a connecting member electrically connecting the first substrate and the second substrate, and
a resin material disposed between the first substrate and the second substrate, wherein
an inorganic filler which increases thermal conductivity is mixed in the resin material.

4. The electronic apparatus according to claim 3, wherein the filling ratio of the inorganic filler into the resin material is set to 70% or more and 90% or less.

5. The electronic apparatus according to claim 3, wherein the particle diameter of the inorganic filler is set to 30 μm or more and 70 μm or less.

6. The electronic apparatus according to claim 3, wherein the material of the inorganic filler is aluminum nitride.

7. The electronic apparatus according to claim 1, wherein at least one of the first substrate and the second substrate is a multilayer wiring substrate, and
one layer of inner layers in the multilayer substrate is a ground layer.

8. The electronic apparatus according to claim 3, wherein at least one of the first substrate and the second substrate is a multilayer wiring substrate, and
one layer of inner layers in the multilayer substrate is a ground layer.

* * * * *